United States Patent [19]
Schneider et al.

[11] Patent Number: 5,676,198
[45] Date of Patent: Oct. 14, 1997

[54] COOLING APPARATUS FOR AN ELECTRONIC COMPONENT

[75] Inventors: Michael G. Schneider; Timothy J. Bland, both of Rockford, Ill.

[73] Assignee: Sundstrand Corporation, Rockford, Ill.

[21] Appl. No.: 340,130

[22] Filed: Nov. 15, 1994

[51] Int. Cl.⁶ .................................................. F28F 7/00
[52] U.S. Cl. .................... 165/80.3; 165/80.4; 165/96; 165/185; 174/16.3; 257/714; 257/722; 361/691; 361/699; 361/707; 361/719
[58] Field of Search .................... 165/80.3, 80.4, 165/96, 185, 146; 174/16.1, 16.3; 257/714, 721, 722; 361/690, 691, 694, 689, 699, 703, 707, 714, 715, 719, 720

[56] References Cited

U.S. PATENT DOCUMENTS

| | | |
|---|---|---|
| 2,964,688 | 12/1960 | McAdam . |
| 3,437,965 | 4/1969 | Ragsdale . |
| 4,186,422 | 1/1980 | Laermer . |
| 4,366,497 | 12/1982 | Block et al. ............... 257/714 |
| 4,587,594 | 5/1986 | McPherson . |
| 4,633,371 | 12/1986 | Nagy et al. . |
| 4,718,163 | 1/1988 | Berland et al. . |
| 4,765,397 | 8/1988 | Chrysler et al. ............... 165/80.3 X |
| 4,867,235 | 9/1989 | Grapes et al. . |
| 4,920,574 | 4/1990 | Yamamoto et al. . |
| 4,953,634 | 9/1990 | Nelson et al. ............... 165/80.3 X |
| 4,982,274 | 1/1991 | Murase et al. . |
| 4,984,066 | 1/1991 | Iversen ............... 257/714 |
| 5,014,117 | 5/1991 | Horvath et al. . |
| 5,028,989 | 7/1991 | Naganuma et al. . |
| 5,072,787 | 12/1991 | Nakamichi . |
| 5,077,601 | 12/1991 | Hatada et al. . |
| 5,113,315 | 5/1992 | Capp et al. . |
| 5,212,625 | 5/1993 | van Andel et al. . |
| 5,218,516 | 6/1993 | Collins et al. . |
| 5,241,452 | 8/1993 | Kitajo . |
| 5,276,584 | 1/1994 | Collins et al. . |
| 5,293,930 | 3/1994 | Pitasi . |
| 5,304,845 | 4/1994 | Lindquist et al. . |

FOREIGN PATENT DOCUMENTS

| | | | |
|---|---|---|---|
| 217438 | 8/1994 | Japan | 174/16.1 |
| 1699022 | 12/1991 | U.S.S.R. | 174/16.3 |
| 1018623 | 1/1966 | United Kingdom | 361/699 |

*Primary Examiner*—Leonard R. Leo
*Attorney, Agent, or Firm*—Kristin L. Chapman

[57] ABSTRACT

This invention relates to a cooling apparatus for at least one electronic component. The cooling apparatus includes a first member which has an inner surface and an outer surface. The outer surface of the first member is adapted for mounting the electronic component thereon at a preselected location. The cooling apparatus also includes a venturi member which is fixedly secured to the inner surface of the first member. The venturi member is positioned to direct a cooling fluid to flow in thermal communication with the inner surface of the first member. The venturi member is also positioned to control a flow velocity of the cooling fluid flowing in thermal communication with a preselected portion of the inner surface of the first member. The preselected portion of the inner surface of the first member is opposite to the preselected location of the outer surface of the first member.

14 Claims, 7 Drawing Sheets

COOLING APPARATUS FOR AN ELECTRONIC COMPONENT

FIELD OF THE INVENTION

This invention relates to a cooling apparatus for at least one electronic component.

BACKGROUND ART

Advanced power electronic designs, especially those of aircraft generating systems, are currently challenged to meet more stringent design requirements, lower cost constraints and higher quality standards. In particular, variable speed constant frequency (VSCF) electrical generating systems must be designed to survive short-term thermal overload conditions and consistently improve their reliability, by controlling the temperatures which high power electronic components reach during operation through liquid cooling.

Thermal management of electronic components via liquid cooling and finned structures has been addressed in the art, as in a patent to Nakamichi, U.S. Pat. No. 5,072,787. Nakamichi discloses a radiator comprising a radiating block including a hollow air path through which cooling air flows, outer cooling faces on which a plurality of heated bodies to be cooled are mounted, and a plurality of cooling fins disposed within the hollow air path so as to engage inner faces of the radiating block wherein the cross-sectional cooling areas vary along the air flow path. While the cooling areas vary along the air flow path in the reference, Nakamichi discloses equalizing the heat transfer rate over the faces to be cooled. Nakamichi does not teach varying the heat transfer rate over a member at selected locations having high and low power electronic components mounted thereon to achieve a venturi effect and allow for the selective placement of high and low power electronic components on the member.

The present invention is directed to achieving the above-referenced objectives.

SUMMARY OF THE INVENTION

More specifically, this invention relates to a cooling apparatus for at least one electronic component. The cooling apparatus includes a first member which has an inner surface and an outer surface. The outer surface of the first member is adapted for mounting the electronic component thereon at a preselected location. The cooling apparatus also includes a venturi member which is fixedly secured to the inner surface of the first member. The venturi member is positioned to direct a cooling fluid to flow in thermal communication with the inner surface of the first member. The venturi member is also positioned to control a flow velocity of the cooling fluid flowing in thermal communication with a preselected portion of the inner surface of the first member. The preselected portion of the inner surface of the first member is opposite to the preselected location of the outer surface of the first member.

BRIEF DESCRIPTION OF THE DRAWINGS

While the specification concludes with claims particularly pointing out and distinctly claiming that which is regarded as the present invention, the organization, the advantages, and further objects of the invention may be readily ascertained by one skilled in the art from the following detailed description when read in conjunction with the accompanying drawings in which:

DESCRIPTION OF THE PREFERRED EMBODIMENTS

Figure 1:
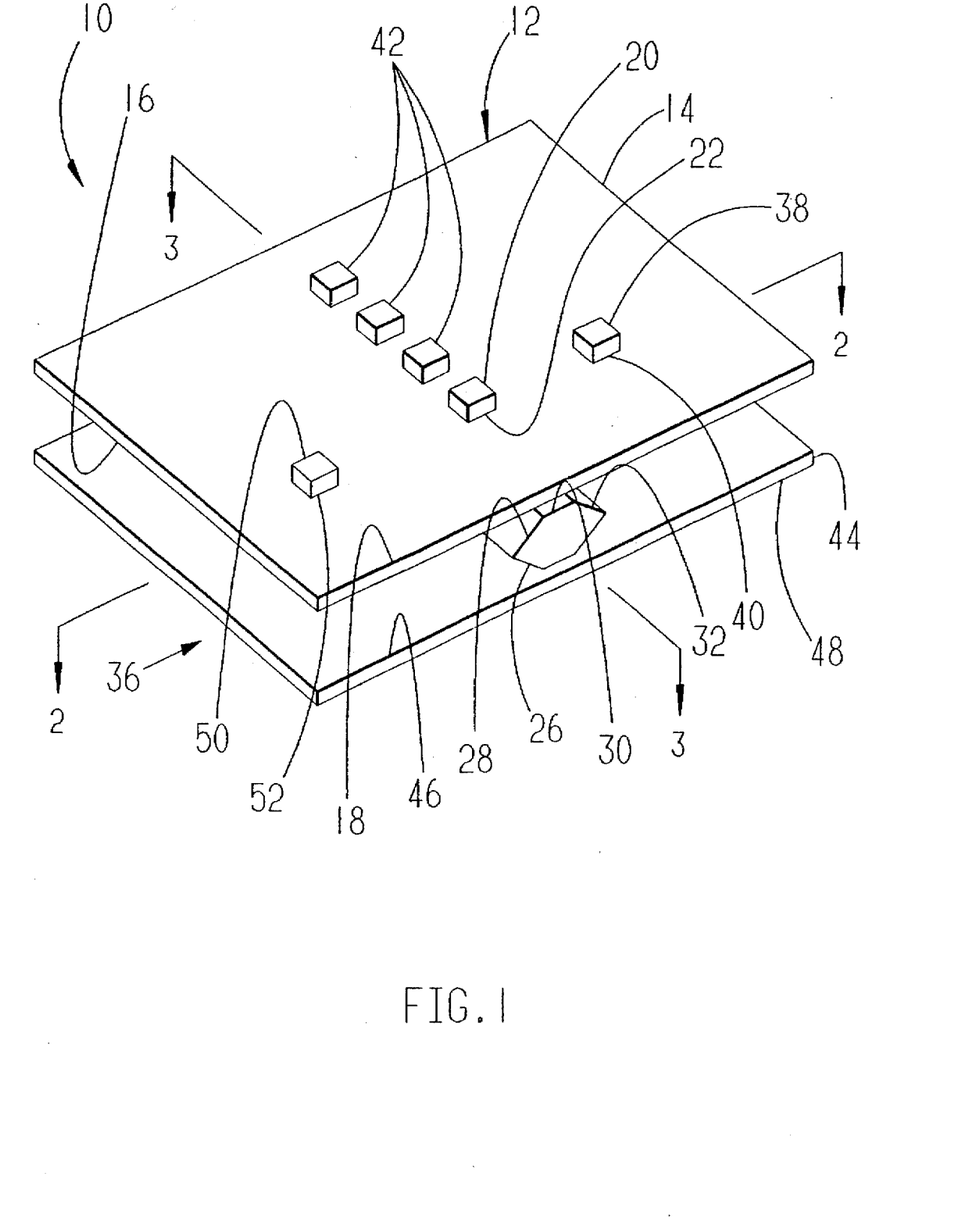
FIG. 1 is an orthogonal view of a cooling apparatus illustrating an embodiment of the instant invention.
Figure 2:
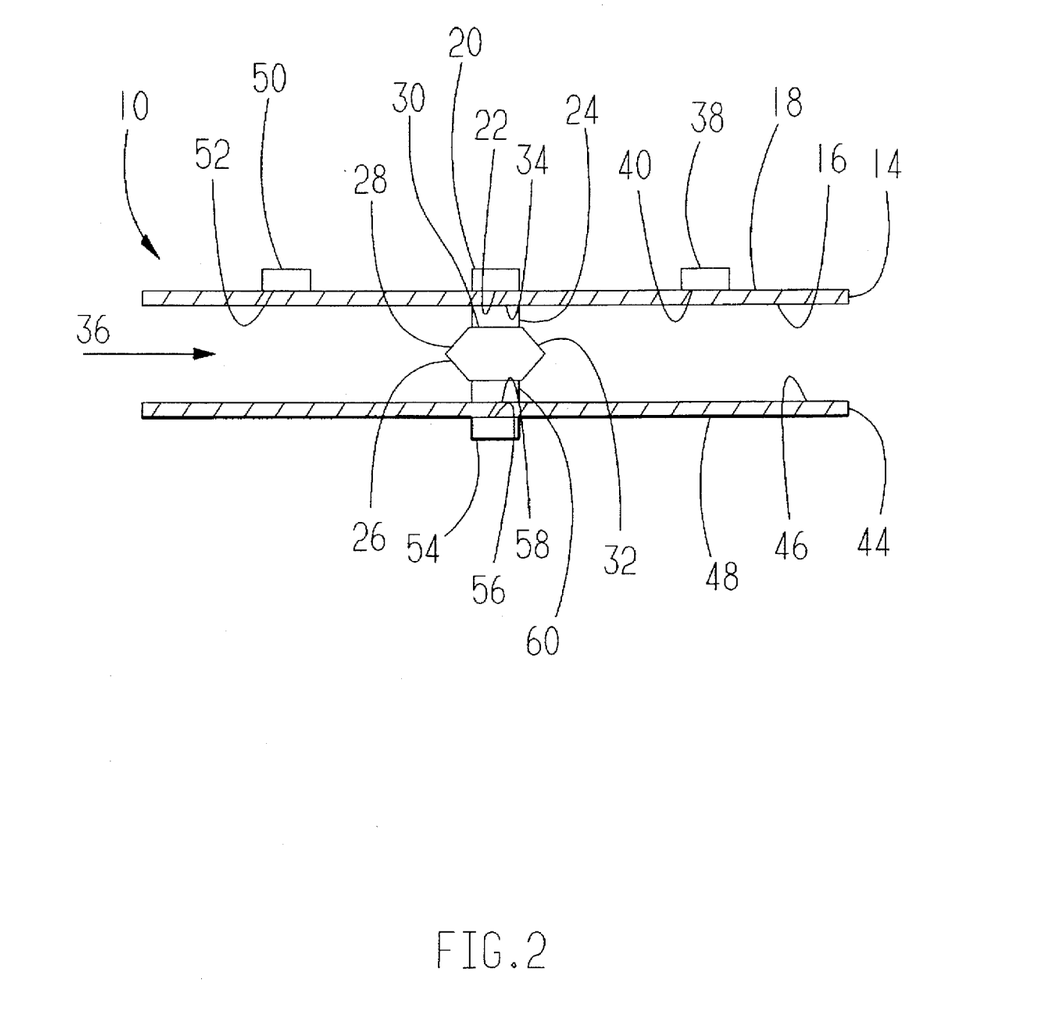
FIG. 2 is a cross-sectional view along the line 2—2 of FIG. 1.
Figure 3:
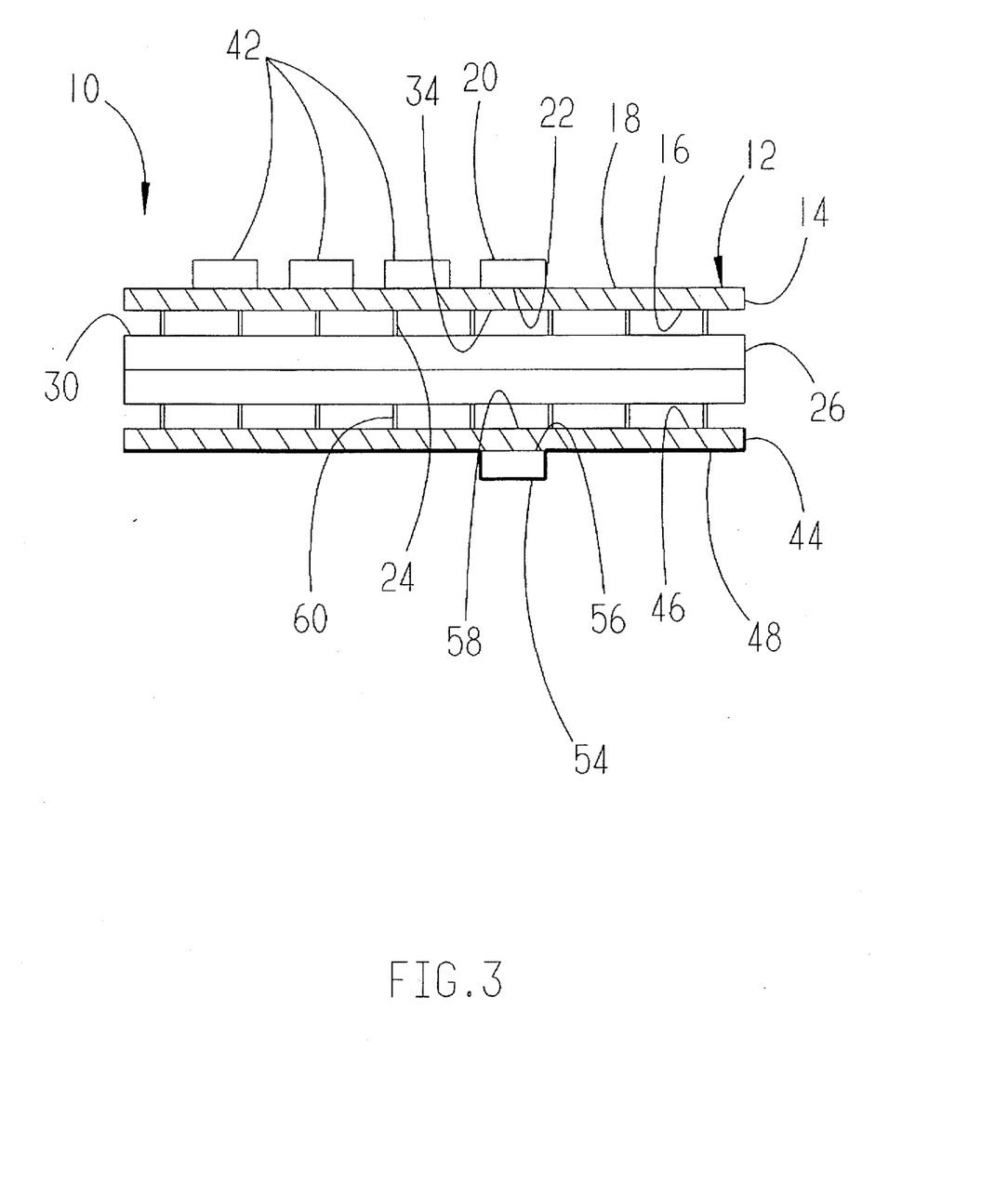
FIG. 3 is a cross-sectional view along the line 3—3 of FIG. 1.

Referring now to the drawings and specifically FIG. 1, a cooling apparatus, generally designated 10, is illustrated in accordance with the instant invention. In a preferred embodiment, the cooling apparatus 10 includes a first member, generally designated 12, which is in the form of a planar member 14 (FIGS. 1–3). The first planar member 14 has an inner surface 16 and an outer surface 18 which is adapted for mounting an electronic component 20 thereon at a preselected location 22. The electronic component 20 may be a high power electronic component such as an IGBT (Insulated Gate Bipolar Transistor) or a MCT (MOSS Controlled Thyristor). It can be appreciated, the first planar member 14, in a preferred embodiment, is made from a highly thermally conductive material such as aluminum.

The inner surface 16 of the first planar member 14 includes a first set of fin members 24 which extend orthogonally from the inner surface 16 of the first planar member 14 (FIG. 3). From such a geometry, it may be appreciated, each of the fin members 24 is spaced in relationship to one another to allow a cooling fluid to flow between the fin members 24. In a preferred embodiment, the first set of fin members 24 may be constructed as an integral portion of the inner surface 16 of the first planar member 14.

As shown in FIGS. 1 & 2, the cooling apparatus 10 also includes a venturi member 26. The venturi member 26 is positioned to direct a cooling fluid, generally designated by direction arrow 36, to flow in thermal communication with the inner surface 16 of the first planar member 14. The venturi member 26 is also positioned to control a flow velocity of the cooling fluid flowing in thermal communication with a preselected portion 34 of the inner surface 16 of the first planar member 14 opposite the preselected location 22 of the outer surface 18 of the first planar member 14 which has the electronic component 20 mounted thereon. Thus, by varying a cooling fluid flow area between the venturi member 26 and the inner surface 16 of the first planar member 14, with the position of the venturi member 26, the flow velocity of the cooling fluid can be controlled at the preselected portion 34 of the inner surface 16 of the first planar member 14 to maximize a heat transfer coefficient and hence, cooling of the electronic component 20 mounted at the preselected location 22 of the outer surface 18 of the first planar member 14 opposite the preselected portion 34 of the inner surface 16.

To control the flow velocity of the cooling fluid, the venturi member 26 may be in the shape of a bifurcated conical member or in the shape of a cylinder having conical shaped ends. The venturi member 26 may include an effuser 28 to accelerate the flow velocity of the cooling fluid as the cooling fluid enters a throat region 30 of the venturi member 26. The throat region 30 is defined by the preselected portion 34 of the inner surface 16 of the first planar member 14 opposite the preselected location 22 of the outer surface 18 of the first planar member 14 where the high power electronic component 20 is mounted thereon. One skilled in the art can appreciate that a plurality of electronic components 42 may be mounted on the outer surface 18 of the first planar member 14 to be cooled by the cooling fluid flowing in thermal communication with the inner surface 16 of the first planar member 14.

In addition, the venturi member 26 may include a diffuser 32 to decelerate the flow velocity of the cooling fluid as the cooling fluid exits the throat region 30 of the venturi member 26, thereby reducing a cooling fluid pressure drop. One skilled in the art may appreciate that low power electronic components 38 and 50 may be additionally mounted on the outer surface 18 of the first planar member 14 either downstream of the diffuser 32 of the venturi member 26 and/or upstream of the effuser 28 of the venturi member 26, as the heat transfer rates necessary to adequately cool the low power electronic components 38 and 50 are not as high as required for the high power electronic component 20 or the plurality of electronic components 42. Additional sets of fin members (not shown) may be incorporated to extend orthogonally from the inner surface 16 of the first planar member 14 corresponding to locations 40 and 52 for mounting the low power electronic components 38 and 50, respectively, on the outer surface 18 of the first planar member 14 to increase the heat transfer surface area available for cooling. Such a geometry allows for the selective placement of high and low power electronic components on the first planar member 14 depending on the cooling criteria required for each of the electronic components. In addition, this geometry allows for a significant reduction in weight of the cooling apparatus 10 because the venturi member 26 and the corresponding throat region 30 may be located near a cooling fluid inlet (not shown) to reduce a high pressure associated with the heat transfer surface area of the first planar member 14, and subsequent pressure drop as the cooling fluid exits the throat region 30 and passes the diffuser 32. However, one skilled in the art can appreciate that a low pressure drop may be desirable in order to reduce the power required to pump the cooling fluid, and the venturi member 26 can be designed to minimize the pressure drop, if necessary. Further, one skilled in the art can appreciate that a plurality of venturi members 26 may be positioned in series along a flow path to cool an electronic component 20 or a plurality of electronic components 42, or a venturi member 26 can be localized for specific cooling of a plurality of high power electronic components 42.

In assembling the cooling apparatus 10, the venturi member 26 is fixedly secured to the inner surface 16 of the first planar member 14. The venturi member 26 may be manufactured from a metal such as aluminum, or to further reduce weight, from a thermoset or injection molded plastic. In a preferred embodiment including the first set of fin members 24, the venturi member 26 is spaced apart from the inner surface 16 of the first planar member 14 and fixedly secured to the first set of fin members 24 by a manufacturing process such as brazing using an interference fit between the first set of fin members 24 and the throat region 30 of the venturi member 26. With such a geometry, one skilled in the art may appreciate, the first set of fin members 24 provide structural integrity to the cooling apparatus 10 when the flow rate of the cooling fluid increases as the cooling fluid passes the effuser 28 and enters the throat region 30 of the venturi member 26 to flow in thermal communication with the inner surface 16 of the first planar member 14. In addition, the first set of fin members 24 augment heat transfer surface area to provide greater cooling potential at the preselected location 22 where the high power electronic component 20 is mounted.

The cooling apparatus 10 may further include a second planar member 44 which has an inner surface 46 and an outer surface 48. The outer surface 48 of the second planar member 44 may be adapted for mounting an additional high power electronic component 54 thereon at an additional preselected location 56. In the preferred embodiment, the inner surface 46 of the second planar member 44 is displaced adjacently parallel to the inner surface 16 of the first planar member 14. With such a geometry, the venturi member 26 is further positioned to direct the cooling fluid, generally designated by the direction arrow 36, to flow in thermal communication with the inner surface 46 of the second planar member 44 and to control a flow velocity of the cooling fluid flowing in thermal communication with a preselected portion 58 of the inner surface 46 of the second planar member 44 which is opposite the additional preselected location 56 of the outer surface 48 of the second planar member 44 where the additional high power electronic component 38 is mounted thereon.

The inner surface 46 of the second planar member 44 may also be positioned to contain the cooling fluid between the inner surface 16 of the first planar member 14 and the inner surface 46 of the second planar member 44. With such a geometry, one can appreciate the capability to package the cooling apparatus 10 in a modular fashion incorporating a series of first and second planar members having high and low power electronic components mounted thereon.

As shown in FIGS. 2 & 3, one may appreciate that the venturi member 26 is further fixedly secured to the inner surface 46 of the second planar member 44. The inner surface 46 of the second planar member 44 may include a second set of fin members 60 which extend orthogonally therefrom, and furthermore, extend as an integral portion of the inner surface 46 of the second planar member 44. In addition, the venturi member 26 may be spaced apart from the inner surface 46 of the second planar member 44 and fixedly secured to the second set of fin members 60 in a similar fashion as the venturi member 26 is fixedly secured to the first set of fin members 24 extending orthogonally from the inner surface 16 of the first planar member 14.

Figure 4:
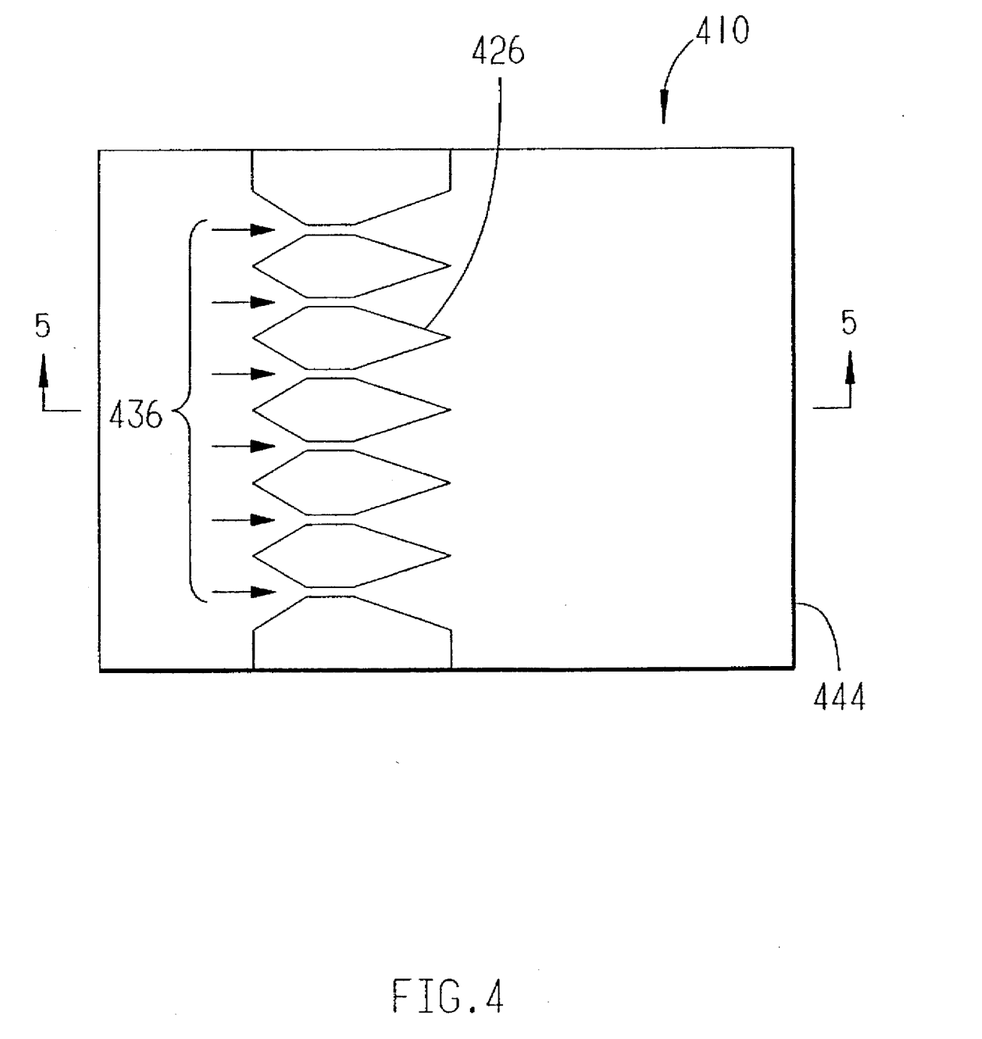
FIG. 4 is a top view of a cooling apparatus with a first planar member removed illustrating an alternative embodiment of the instant invention.
Figure 5:
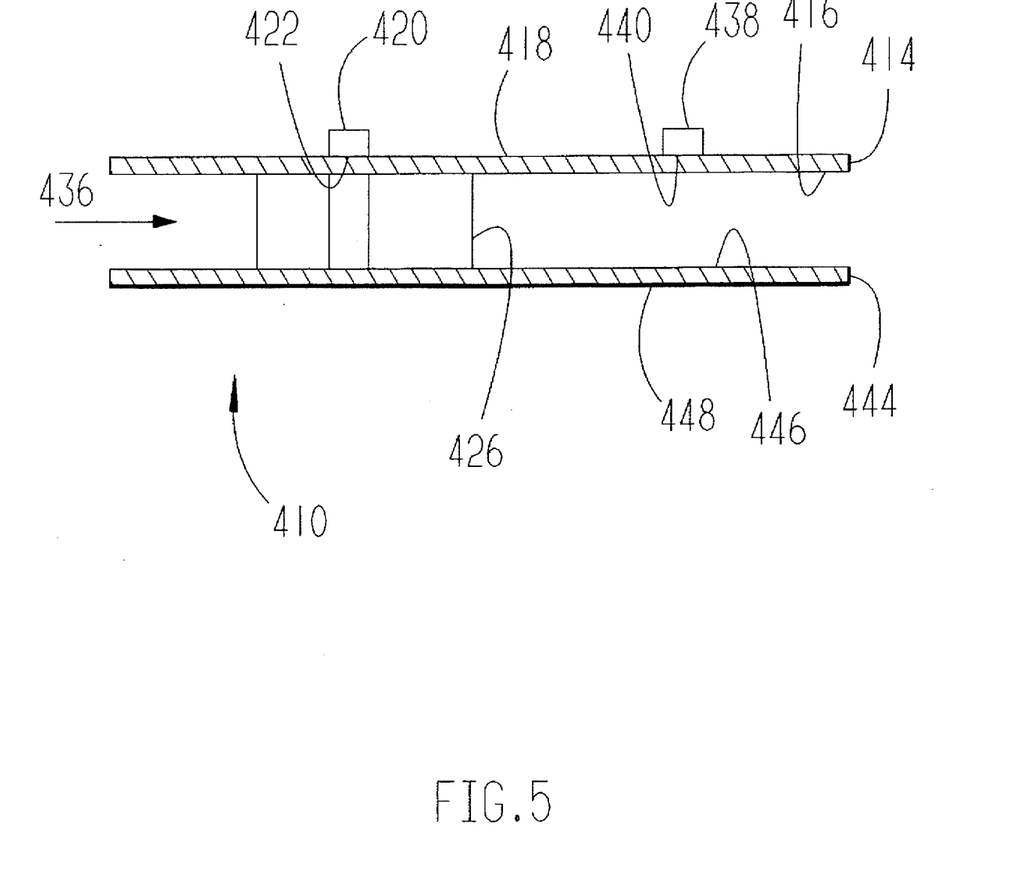
FIG. 5 is a cross-sectional view along the line 5—5 of FIG. 4.

FIGS. 4 & 5 depict an alternate embodiment of a cooling apparatus, generally designated 410, in accordance with the instant invention. In this embodiment, the cooling apparatus 410 includes a first planar member 414 (not shown in FIG. 4), having an inner surface 416 and an outer surface 418, and a second planar member 444 having an inner surface 446 and an outer surface 448. The inner surface 446 of the second planar member 444 is displaced adjacently parallel to the inner surface 416 of the first planar member 414, and may be positioned to contain a cooling fluid between the inner surfaces 416 and 446 of the first and second planar members 414 and 444, respectively.

As depicted in FIG. 5, the outer surface 418 of the first planar member 414 is adapted for mounting a high power electronic component 420 thereon at a preselected location 422. In light of the foregoing discussion, one skilled in the art can appreciate that the outer surface 448 of the second planar member 444 may also be adapted for mounting an additional high power electronic component (not shown) thereon, depending on design requirements and packaging constraints.

The alternate embodiment of the cooling apparatus 410 includes a plurality of venturi members 426 which are spaced in proximate relationship to each other and positioned to direct the cooling fluid, generally shown by direction arrows 436, to flow between the venturi members 426, and in thermal communication with the inner surfaces 416 and 446 of the respective first and second planar members 414 and 444. The venturi members 426 are also positioned to control a flow velocity of the cooling fluid flowing between the venturi members 426, and in thermal communication with the inner surfaces 416 and 446 of the respective first and second planar members 414 and 444. Each of the venturi members 426 may be in the shape of a bifurcated conical member. As can be appreciated with this geometry, the venturi members 426 are fixedly secured to the inner surfaces 416 and 446 of the first and second planar members 414 and 444, respectively. This may be accomplished through a manufacturing process such as brazing.

As with the embodiment depicted in FIGS. 1–3, the geometry of FIGS. 4 & 5 allows for the selective placement of high and low power electronic components on the first and second planar members 414 and 444 depending on the cooling criteria required for each of the electronic components. In addition, this alternate embodiment allows for a significant reduction in weight of the cooling apparatus 410 because the venturi members 426 may be located near a cooling fluid inlet (not shown) to reduce a high pressure associated with the heat transfer surface area of the first and second planar members 414 and 444, and subsequent pressure drop as the cooling fluid passes the venturi members 426. Further, as can be appreciated, the venturi members 426 may be selectively positioned to accommodate additional high power components in locations other than those depicted in FIG. 4.

Figure 6:
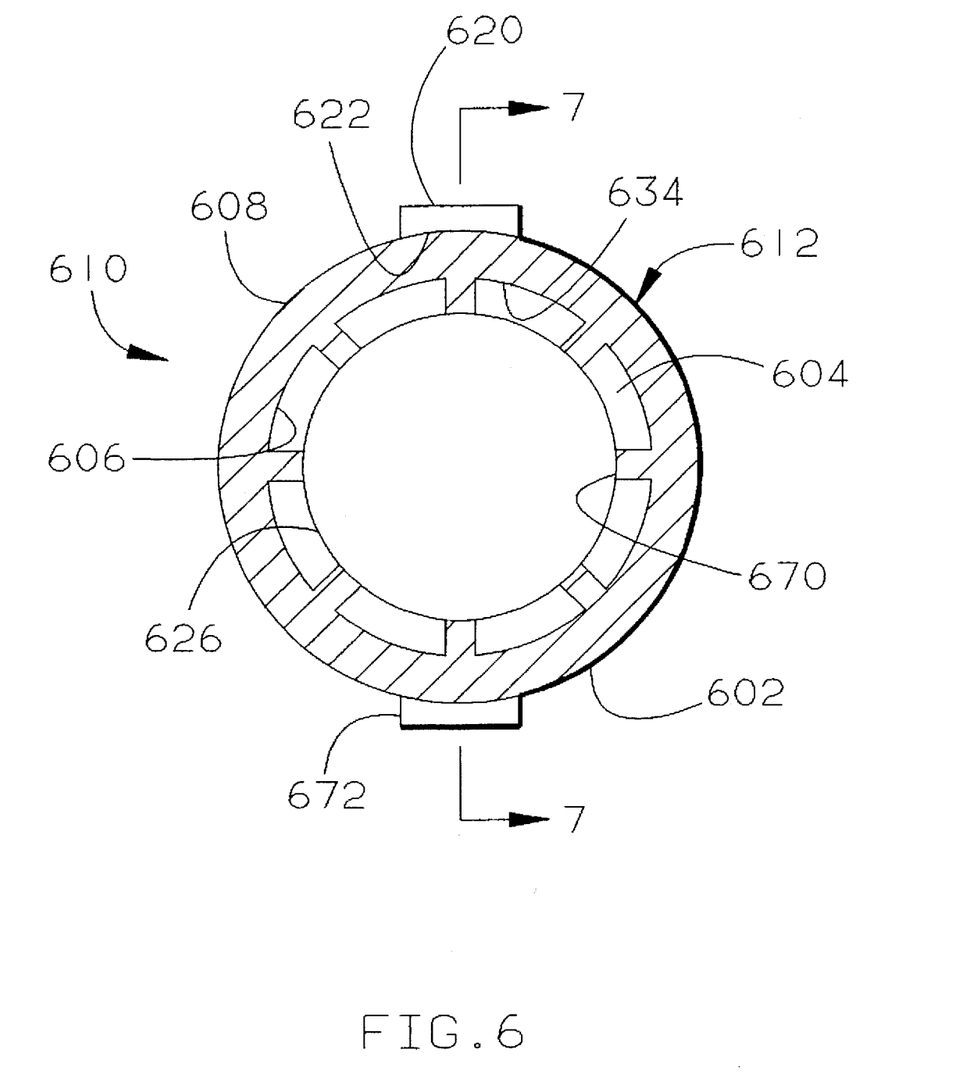
FIG. 6 is a cross-sectional view of a cooling apparatus illustrating an alternative embodiment of the instant invention.
Figure 7:
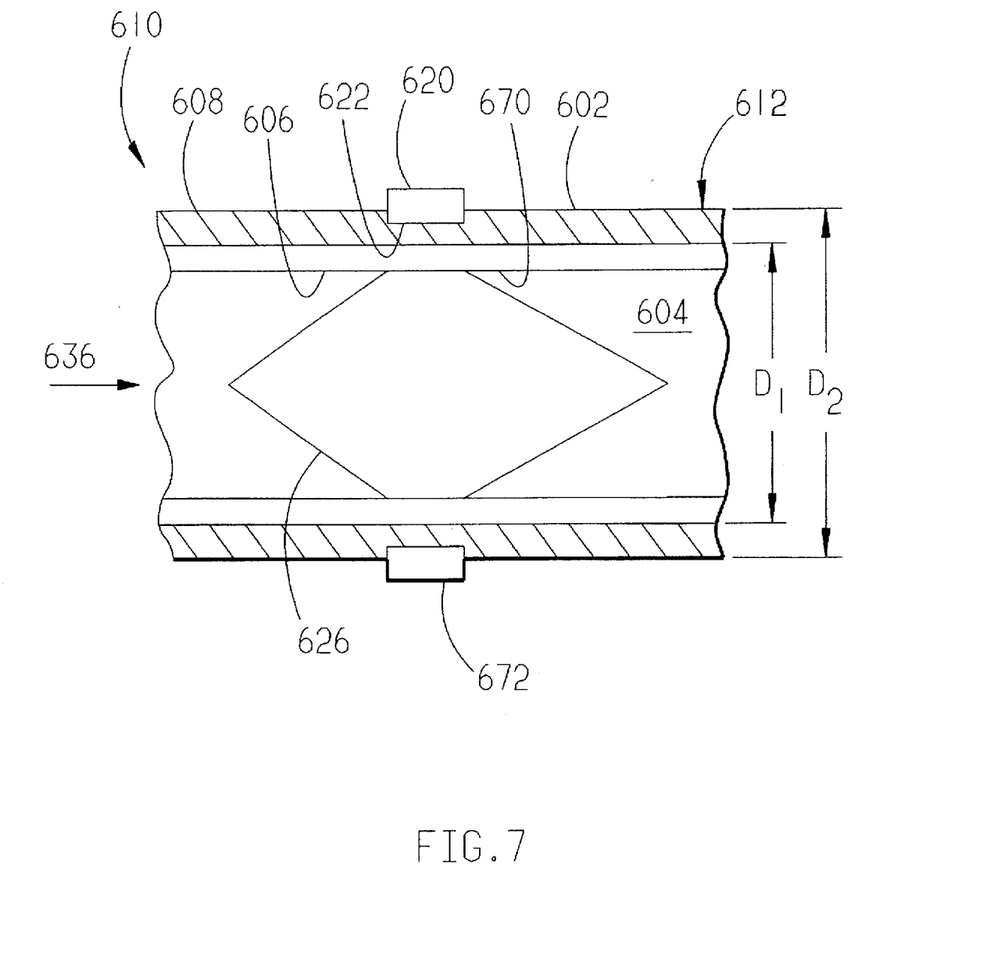
FIG. 7 is a cross-sectional view along the line 7—7 of FIG. 6.

FIGS. 6 & 7 depict a further embodiment of a cooling apparatus, generally designated 610, in accordance with the instant invention. In this embodiment, the cooling apparatus includes a first member 612 which is in the form of an elongated tube 602 (FIG. 7). The elongated tube 602 has a central opening 604 therethrough. With such a geometry, it can be appreciated that the elongated tube 602 has an inner surface 606, which is defined by an inner diameter, $D_1$, about the opening 604 and concentrically located within an outer surface 608 of the elongated tube 602. The outer surface 608 is defined by an outer diameter, $D_2$, about the opening 604 and is adapted for mounting an electronic component 620 thereon at a preselected location 622. As shown in FIG. 6, the inner surface 606 of the elongated tube 602 includes a plurality of fin members 670 which extend radially inward therefrom into the opening 604 of the elongated tube 602.

In this alternate embodiment, the cooling apparatus 610 also includes a venturi member 626 fixedly secured to the plurality of fin members 670 by a manufacturing process such as brazing or swaging. The venturi member 626 is positioned to direct a cooling fluid, generally designated by direction arrow 636, between the fin members 670 and in thermal communication with the inner surface 606 of the elongated tube 602. The venturi member 626 is also positioned to control a flow rate of the cooling fluid flowing in thermal communication with a preselected portion 634 of the inner surface 606 of the elongated tube 602 opposite the preselected location 622 of the outer surface 608 of the elongated tube 602 which has the electronic component 620 mounted thereon. Thus, by varying a cooling fluid flow area, between the venturi member 626 and the inner surface 606 of the elongated tube 602, the flow velocity of the cooling fluid can be controlled at the preselected portion 634 of the inner surface 606 of the elongated tube 602 to maximize a heat transfer coefficient and hence, cooling of the electronic component 620 mounted at the preselected location 622 of the outer surface 608 of the elongated tube 602 opposite the preselected portion 634 of the inner surface 606 of the elongated tube 602. As shown in FIG. 7, the venturi member 626 may be in the shape of a bifurcated conical member.

In light of the foregoing disclosure, one skilled in the art can appreciate with this tubular geometry that the outer surface 608 of the elongated tube 602 may be adapted for mounting a plurality of additional electronic components thereon, as illustrated by a component 672, depending on design requirements and packaging constraints.

Numerous modifications in the alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

We claim:

1. A cooling apparatus for at least one electronic component, comprising:
   a first member having an inner surface and an outer surface adapted for mounting the electronic component thereon at a preselected location; and
   a venturi member fixedly secured to the inner surface of the first member, the venturi member being positioned to direct a cooling fluid to flow in thermal communication with the inner surface of the first member, and to increase a flow velocity of the cooling fluid flowing in thermal communication with a preselected portion of the inner surface of the first member opposite the preselected location of the outer surface of the first member, the cooling fluid flowing in a flow direction, the venturi member having a length along the flow direction, the first member being in the form of a planar member such that the inner surface of the first member adjacent the venturi member is planar substantially across the length of the venturi member.

2. The cooling apparatus of claim 1 further including a second planar member having an inner surface and an outer surface adapted for mounting an additional electronic component thereon at an additional preselected location, wherein the inner surface of the second planar member is displaced adjacently parallel to the inner surface of the first planar member, wherein the venturi member is further fixedly secured to the inner surface of the second planar member, and wherein the venturi member is further positioned to direct the cooling fluid to flow in thermal communication with the inner surface of the second planar member and to control a flow velocity of the cooling fluid flowing in thermal communication with a preselected portion of the inner surface of the second planar member opposite the additional preselected location of the outer surface of the second planar member.

3. The cooling apparatus of claim 2 further including a plurality of venturi members fixedly secured to the inner surfaces of the first and second planar members, wherein the venturi members are spaced in proximate relationship to each other and further positioned to direct the cooling fluid to flow between the venturi members and to control the flow velocity of the cooling fluid flowing between the venturi members.

4. The cooling apparatus of claim 1 further including a second planar member having an inner surface and an outer surface, wherein the inner surface of the second planar member is displaced adjacently parallel to the inner surface of the first planar member and positioned to contain the cooling fluid between the inner surfaces of the first and second planar members, and wherein the venturi member is further fixedly secured to the inner surface of the second planar member.

5. The cooling apparatus of claim 4 further including a plurality of venturi members fixedly secured to the inner surfaces of the first and second planar members, wherein the venturi members are spaced in proximate relationship to each other and further positioned to direct the cooling fluid to flow between the venturi members and to control the flow velocity of the cooling fluid flowing between the venturi members.

6. The cooling apparatus of claim 1 further including a plurality of venturi members fixedly secured to the inner surface of the first planar member, wherein the venturi members are spaced in proximate relationship to each other and further positioned to direct the cooling fluid to flow between the venturi members and to control the flow velocity of the cooling fluid flowing between the venturi members.

7. The cooling apparatus of claim 1 wherein the venturi member is in the shape of a bifurcated conical member.

8. The cooling apparatus of claim 1 wherein the venturi member is disposed away from a second portion of the inner surface of the first member opposite a second portion of the outer surface of the first member, said second portion of the outer surface of the first member being adapted for mounting another electronic component thereon.

9. A cooling apparatus for at least one electronic component, comprising:

a first planar member having an inner surface and an outer surface adapted for mounting the electronic component thereon at a preselected location; and a venturi member fixedly secured to the inner surface of the first member, the venturi member being positioned to direct a cooling fluid to flow in thermal communication with the inner surface of the first member and to control a flow velocity of the cooling fluid flowing in thermal communication with a preselected portion of the inner surface of the first member opposite the preselected location of the outer surface of the first member;

wherein the inner surface of the first planar member includes a first set of fin members extending orthogonally therefrom, wherein the venturi member is spaced apart from the inner surface of the first planar member, and wherein the venturi member is fixedly secured to the first set of fin members.

10. The cooling apparatus of claim 9 wherein the first set of fin members is an integral portion of the inner surface of the first planar member.

11. A cooling apparatus for at least one electronic component, comprising:

a first planar member having an inner surface and an outer surface adapted for mounting the electronic component thereon at a preselected location;

a venturi member fixedly secured to the inner surface of the first member, the venturi member being positioned to direct a cooling fluid to flow in thermal communication with the inner surface of the first member and to control a flow velocity of the cooling fluid flowing in thermal communication with a preselected portion of the inner surface of the first member opposite the preselected location of the outer surface of the first member; and a second planar member having an inner surface and an outer surface adapted for mounting an additional electronic component thereon at an additional preselected location wherein the inner surface of the second planar member is displaced adjacently parallel to the inner surface of the first planar member, wherein the venturi member is further fixedly secured to the inner surface of the second planar member, wherein the venturi member is further positioned to direct the cooling fluid to flow in thermal communication with the inner surface of the second planar member and to control a flow velocity of the cooling fluid flowing in thermal communication with a preselected portion of the inner surface of the second planar member opposite the additional preselected location of the outer surface of the second planar member, wherein the inner surface of the first planar member includes a first set of fin members extending orthogonally therefrom, wherein the inner surface of the second planar member includes a second set of fin members extending orthogonally therefrom, wherein the venturi member is spaced apart from the inner surfaces of the first and second planar members, and wherein the venturi member is fixedly secured to the first and second sets of fin members.

12. The cooling apparatus of claim 11 wherein the first and second sets of fin members are integral portions of the inner surfaces of the first and second planar members, respectively.

13. A cooling apparatus for at least one electronic component, comprising:

a first substantially planar member having an inner planar surface and an outer planar surface adapted for mounting the electronic component thereon at a preselected location, the inner planar surface of the first planar member including a first set of fin members extending orthogonally therefrom;

a second substantially planar member having an inner planar surface and an outer planar surface adapted for mounting an additional electronic component thereon at an additional preselected location, the inner planar surface of the second planar member displaced adjacently parallel to the inner planar surface of the first planar member, the inner planar surface of the second planar member including a second set of fin members extending orthogonally therefrom; and a venturi member spaced apart from the inner surfaces of the first and second planar members and fixedly secured to the first and second sets of fin members, the venturi member being positioned to direct a cooling fluid to flow in thermal communication with the inner planar surfaces of the first and second planar members and to control a flow velocity of the cooling fluid flowing in thermal communication with preselected portions of the inner planar surfaces of the first and second planar members opposite the preselected locations of the outer planar surfaces of the first and second planar members, respectively.

14. The cooling apparatus of claim 13 wherein the venturi member is in the shape of a bifurcated conical member.

* * * * *